(12) United States Patent
Fan et al.

(10) Patent No.: US 10,976,673 B2
(45) Date of Patent: Apr. 13, 2021

(54) LEVELLABLE MASK REPOSITORY DEVICE (71) Applicant: SHANGHAI MICRO ELECTRONICS EQUIPMENT (GROUP) CO., LTD., Shanghai (CN)

(72) Inventors: Yongwei Fan, Shanghai (CN); Huaiyang Chen, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 213 days.

(21) Appl. No.: 16/321,664

(22) PCT Filed: Jul. 25, 2017

(86) PCT No.: PCT/CN2017/094273
§ 371 (c)(1),
(2) Date: Jan. 29, 2019

(87) PCT Pub. No.: WO2018/019226
PCT Pub. Date: Feb. 1, 2018

(65) Prior Publication Data
US 2020/0089133 A1    Mar. 19, 2020

(30) Foreign Application Priority Data
Jul. 29, 2016   (CN) .......................... 201610614615.2

(51) Int. Cl.
G03F 7/20       (2006.01)

(52) U.S. Cl.
CPC ............................... *G03F 7/70741* (2013.01)

(58) Field of Classification Search
CPC . G03F 7/70741; G03F 7/7075; G03F 7/70983
USPC ......................................................... 355/72–76
See application file for complete search history.

(56) References Cited

U.S. PATENT DOCUMENTS

| | | | |
|---|---|---|---|
| 7,408,615 B2 * | 8/2008 | Kuit | G03F 7/70733 355/53 |
| 2002/0044856 A1 | 4/2002 | Foulke et al. | |
| 2002/0126269 A1 * | 9/2002 | Sato | G03F 7/70983 355/77 |
| 2003/0031545 A1 | 2/2003 | DeMarco et al. | |
| 2005/0280797 A1 * | 12/2005 | Kuit | G03F 7/7075 355/72 |
| 2007/0155029 A1 | 7/2007 | Hamren et al. | |
| 2012/0042988 A1 * | 2/2012 | Shikata | H01L 21/67386 141/383 |
| 2013/0038852 A1 | 2/2013 | Toh et al. | |

(Continued)

FOREIGN PATENT DOCUMENTS

| | | |
|---|---|---|
| CN | 202369121 U | 8/2012 |
| CN | 103901733 A | 7/2014 |

(Continued)

*Primary Examiner* — Hung Nguyen
(74) *Attorney, Agent, or Firm* — Muncy, Geissler, Olds & Lowe, P.C.

(57) ABSTRACT

A levellable reticle library assembly includes a reticle library assembly (4), a pivot assembly (3) and a frame assembly (2). The reticle library assembly (4) is disposed on the frame assembly (2) so that it is able to be leveled by the pivot assembly (3) via the frame assembly (2), and the reticle library assembly (4) can also be leveled by the frame assembly (2).

13 Claims, 5 Drawing Sheets

(56) References Cited

U.S. PATENT DOCUMENTS

2014/0112741 A1\* 4/2014 Yoshioka .............. H01L 21/677
                                                                             414/222.01
2017/0343906 A1\* 11/2017 Huang .................. G06K 7/1413

FOREIGN PATENT DOCUMENTS

| CN | 203714553 U | 7/2014 |
|----|---|---|
| CN | 203838474 U | 9/2014 |
| CN | 105807574 A | 7/2016 |
| JP | S60154618 A | 8/1985 |
| JP | H0527881 A | 2/1993 |
| JP | H05278813 A | 10/1993 |
| JP | 2001110868 A | 4/2001 |
| JP | 2005345876 A | 12/2005 |
| JP | 4171187 B2 | 10/2008 |
| WO | WO2002/093262 A1 | 11/2002 |
| WO | WO 2007149513 A2 | 12/2007 |

\* cited by examiner

LEVELLABLE MASK REPOSITORY DEVICE

TECHNICAL FIELD

The present invention relates to the field of reticle transfer and, in particular, to a levellable reticle library system.

BACKGROUND

A photolithographic tool is used to expose a reticle pattern onto a silicon or glass substrate. In order to facilitate fabrication, reticle management and operation of robotic arms, in addition to an external reticle library, some photolithography tools further include a specialized internal reticle library for storing a number of reticles.

Operation of a reticle transfer system in such a photolithography tool typically involves: placing a reticle cassette loaded with reticles into the external reticle library; unlocking the external reticle library by an unlocking mechanism; transferring the reticle cassette into the internal reticle library after QR-code scanning; taking out a reticle from the internal reticle library and placing it on a mask stage for exposure; and after the completion of exposure, transferring the reticle by the mechanical arm from the mask stage back to the internal reticle library.

As can be seen from the above workflow, a reticle storage system reasonable in terms of structure and use can enhance reticle transfer efficiency and accuracy and improve reticle cleanness, supplying the photolithography tool with more reliable reticles.

Figure 1:
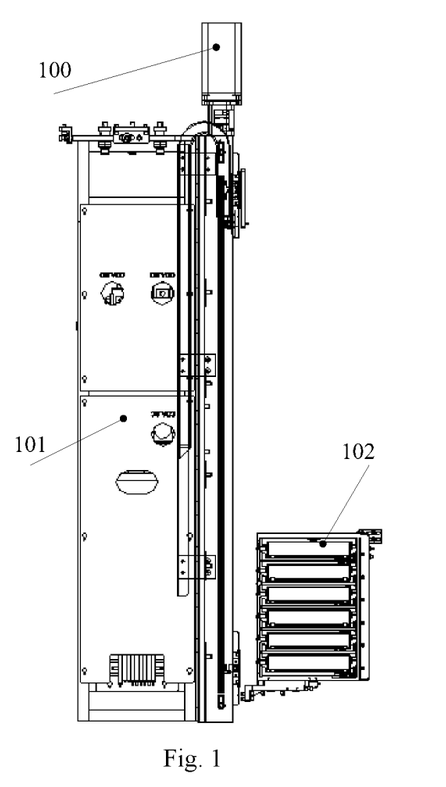
FIG. 1 is a schematic illustration of a conventional reticle storage system.

Referring to FIG. 1, a conventional reticle storage system is movable up and down and the reticle library is fastened to a shaft. The conventional reticle storage system includes a transmission mechanism 100, a support frame 101 and a reticle library 102. The reticle library has a number of compartments and is moveable along the Z-direction under the action of the transmission mechanism 100 via a connecting member.

This design has several disadvantages, such as for example: the reticle library is heavy and tends to cause wear of the transmission mechanism which may result in the formation of particulates therein; the reticle library is always open, leaving a chance for the contained reticles to be contaminated on the surface; the reticles may deform, making the subsequent operation more difficult; and it is incapable of secure interlocking. Moreover, it is structured like a cantilever and hence tends to deform remarkably under heavy loads. Coupled with some design errors, adjustments in the Z-direction and leveling initially before use are necessary for its normal operation. If it is not properly leveled initially, elimination of any considerable reticle library non-levelness during subsequent use will be time-consuming.

SUMMARY OF THE INVENTION

It is an objective of the present invention to solve the above problem of time-consuming elimination of any considerable non-levelness occurring during subsequent use with the convention system.

To this end, the present invention provides a reticle library system with leveling capabilities, including a reticle library assembly, a pivot assembly and a frame assembly. The reticle library assembly is disposed on the frame assembly so that the reticle library assembly is able to be leveled by the pivot assembly via the frame assembly, and the reticle library assembly is also able to be leveled relative to the frame assembly.

Optionally, the reticle library system may further include a seal disposed on the reticle library assembly in order to seal an opening of the reticle library assembly.

Optionally, the seal may include a main body, a sealing door, a reticle library assembly-interfacing plate and a pushback mechanism, the main body connected to the reticle library assembly or to the frame assembly via the reticle library assembly-interfacing plate, the pushback mechanism mounted on the main body, the sealing door configured to be closed or opened to seal or not seal the opening of the reticle library assembly, the pushback mechanism driven to control the opening or closing of the sealing door.

Optionally, the seal may further include an interlocking sensor disposed on the main body in order to detect whether a mechanical arm has arrived at a predetermined position for taking away or placing a reticle, with the pushback mechanism driven to control the opening or closing of the sealing door based on a detection result of the interlocking sensor.

Optionally, the pivot assembly may include a pivot shaft, an adjusting mechanism, a frame assembly-interfacing member and a universal bearing assembly, two ends of the pivot shaft respectively coupled to the adjusting mechanism and the universal bearing assembly, the pivot shaft fixed to the frame assembly via the frame assembly-interfacing member, the adjusting mechanism configured to level the frame assembly and the reticle library assembly thereon by adjusting an orientation of the pivot shaft.

Optionally, the adjusting mechanism may include a first spherical bearing, an upper bearing housing, a bearing housing connecting block, a wedge block and a set screw, the set screw engaging the wedge block along a vertical Z-direction so that an X-directional displacement of the wedge block is achievable by means of a Z-directional advancement of the set screw, the wedge block connected to the upper bearing housing via the bearing housing connecting block, the upper bearing housing connected to one end of the pivot shaft via the first spherical bearing so that the pivot shaft is able to pivot in an Ry-direction relative to an inner race of the first spherical bearing by means of the X-directional displacement of the wedge block, where the Ry-direction is defined as a rotational direction about a horizontal Y-direction which is perpendicular to the horizontal X-direction.

Optionally, the adjusting mechanism may further include an adjusting screw capable of changing relative positions of the bearing housing connecting block and the upper bearing housing along the Y-direction so as to cause the upper bearing housing to swing in an Rx-direction relative to the inner race of the first spherical bearing, where the Rx-direction is defined as a rotational direction about the horizontal X-direction.

Optionally, the universal bearing assembly may include a second spherical bearing, a lower bearing housing and a Z-directional adjustment block, the lower bearing housing connected to one end of the pivot shaft via the second spherical bearing, the Z-directional adjustment block configured to change a Z-directional position of the pivot shaft via a top block.

Optionally, the frame assembly may include a reticle library assembly-supporting frame and a storage system-supporting frame under the reticle library assembly-supporting frame, wherein reticle library assembly is supported on the reticle library assembly-supporting frame, and wherein a bottom of the storage system-supporting frame is provided with a locking member for locking a configuration resulting from leveling by the pivot assembly.

Optionally, the frame assembly may be provided with an air-bath opening which is connected externally to an inert gas source and internally to the reticle library assembly by an air-bath tubing.

Optionally, the frame assembly may be provided with a particulate extraction opening connected to the reticle library assembly by a particulate extraction tubing.

Optionally, the reticle library assembly may include a reticle library frame, a reticle library retained by the reticle library frame and reticle bays within the reticle library, the reticle bays configured to accommodate reticles.

Optionally, leveling between the reticle library assembly and the frame assembly may be accomplished by a number of leveling screws.

Optionally, the reticle library assembly may include deformation sensors.

The present invention enables two stages of leveling respectively between the reticle library assembly and the frame assembly and between the frame assembly and the pivot assembly, which allow quick leveling with lower labor intensity.

In further optional embodiments, adjustments in the Z-directions, reduction of particulates on reticle surface, avoidance of deformation, secure interlocking, screw level-based locking and ease of maintenance can be made possible.

In these figures: 1—air bath tubing; 2—frame assembly; 3—pivot assembly; 4—reticle library assembly; 5—seal; 6—particulate extraction tubing;
- 201—storage system-supporting frame; 202—pivot interfacing opening; 203—reticle library assembly-supporting frame; 204—air-bath opening; 205—screw lever; 206—guide tube; 207—threaded guide channel; 208—particulate extraction opening;
- 301—adjusting mechanism; 302—pivot shaft; 303—universal bearing assembly; 304—frame assembly-interfacing member;
- 3011—interfacing plate; 3012—upper bearing housing; 3013—first spherical bearing; 3014—adjusting screw; 3015—wedge block; 3016—set screw; 3017—locking screw; 3018—bearing housing connecting block;
- 3031—second spherical bearing; 3032—lower bearing housing; 3033—locking nut; 3034—Z-directional adjustment block; 3035—top block;
- 401—deformation sensor; 402—level screw; 403—air bath opening; 404—reticle library frame; 405—reticle bay; 406—cover; 407—presence sensor;
- 500—main body; 501—sealing door; 502—reticle library assembly-interfacing plate; 503—pushback mechanism; 504—interlocking sensor.

DETAILED DESCRIPTION

The present invention will be described in detail below with reference to FIGS. 1 to 8 which illustrate optional embodiments of the invention. Changes and modifications can be made to them by those of ordinary skill in the art without departing from the spirit and scope of the present invention.

Figure 2:
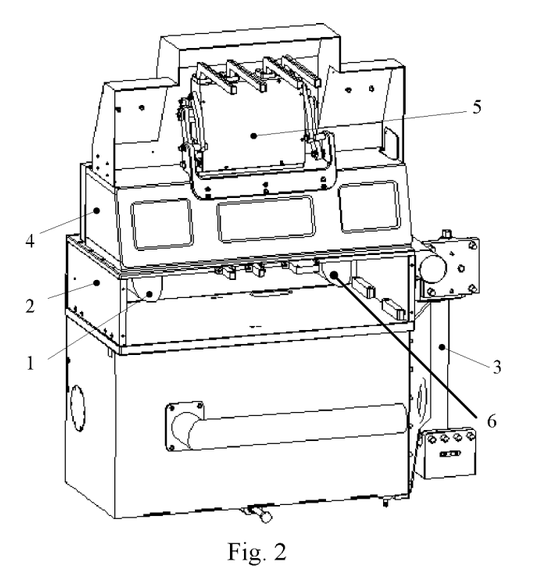
FIG. 2 is a schematic illustration of a reticle library system according to an optional embodiment of the present invention.

The present invention provides a reticle library system with leveling capabilities including a reticle library assembly 4, a pivot assembly 3 and a frame assembly 2. The reticle library assembly 4 resides on the frame assembly 2 so that it can be leveled by the pivot assembly 3 via the frame assembly 2. Moreover, the reticle library assembly 4 can also be leveled relative to the frame assembly 2.

Therefore, the present invention enables two stages of leveling, one stage is performed between the reticle library assembly 4 and the frame assembly 2, and the other stage is performed between the frame assembly 2 and the pivot assembly 3, such that two stages of leveling can be performed, which allow quick leveling with lower labor intensity.

Figure 4:
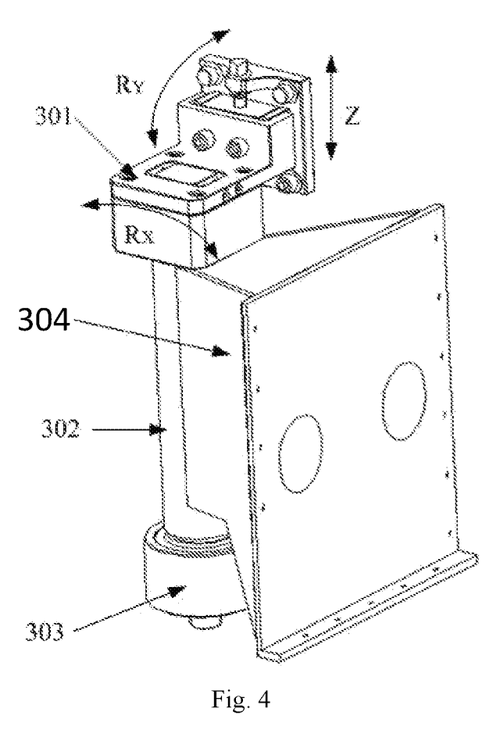
FIG. 4 is a schematic illustration of a pivot assembly according to an optional embodiment of the present invention.
Figure 5:
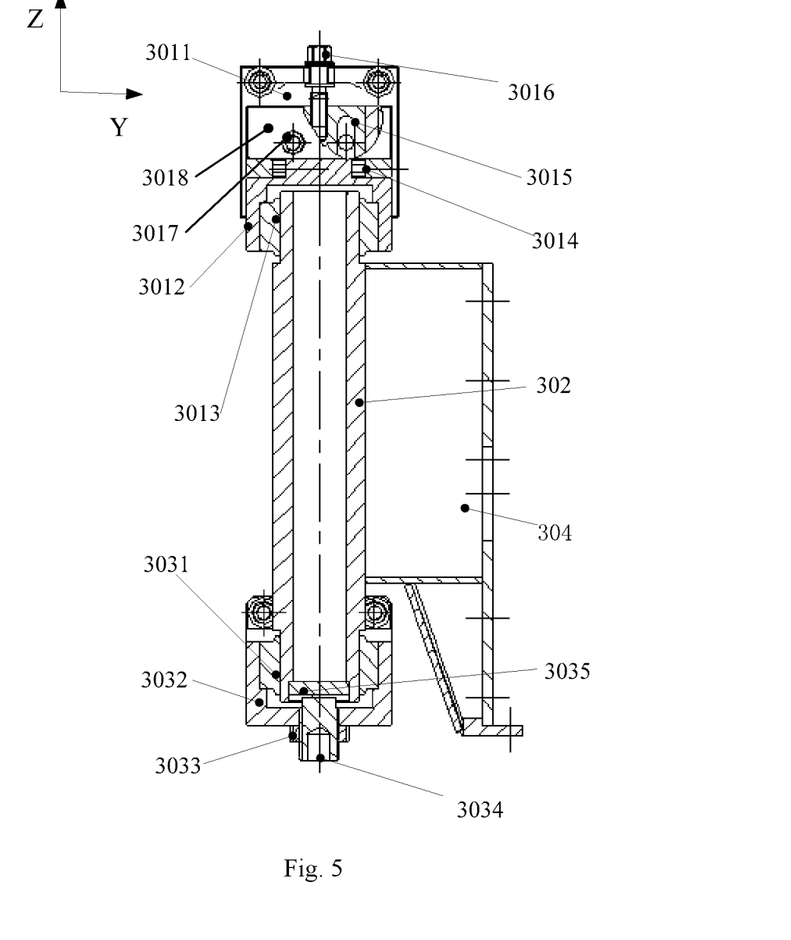
FIG. 5 shows a schematic cross-sectional view of a pivot assembly according to an optional embodiment of the present invention.

The pivot assembly 3 will be described below in detail with reference to FIGS. 4 and 5. The pivot assembly 3 includes a pivot shaft 302, an adjusting mechanism 301, a frame assembly-interfacing member 304 and a universal bearing assembly 303. The pivot shaft 302 is coupled at one end to the adjusting mechanism 301 and at the other end to the universal bearing assembly 303. The pivot shaft 302 is also fixed to the frame assembly 2 via the frame assembly-interfacing member 304. The adjusting mechanism 301 levels the frame assembly 2 and the reticle library assembly 4 thereon by adjusting the orientation of the pivot shaft.

Figure 6:
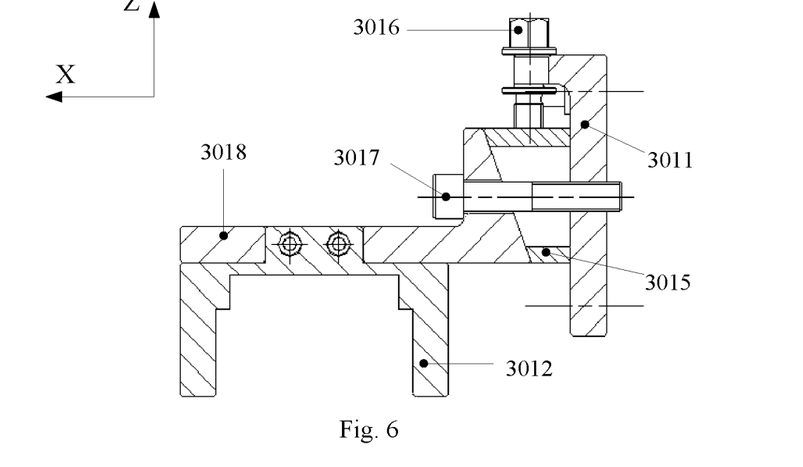
FIG. 6 is a partial cross-sectional view schematically illustrating an adjusting mechanism according to an optional embodiment of the present invention.

The adjusting mechanism 301 will be described in detail below.

The adjusting mechanism 301 includes a first spherical bearing 3013, an upper bearing housing 3012, a bearing housing connecting block 3018, a wedge block 3015 and a set screw 3016. The set screw 3016 engages the wedge block 3015 along the Z-direction and, therefore, its Z-directional advancement can cause a displacement of the wedge block 3015 along the X-direction. The wedge block 3015, as suggested by its name, is a wedge-shaped member with a slope surface which can convert the Z-directional movement to X-directional movement. This will be readily understood by those skilled in the art, and a further description thereof is deemed unnecessary. The wedge block 3015 is connected to the upper bearing housing 3012 via the bearing housing connecting block 3018. The upper bearing housing 3012 is connected to one end of the pivot shaft 302 via the first spherical bearing 3013. In this way, as a result of the X-directional displacement of the wedge block 3015, the pivot shaft 302 will pivot in the Ry-direction relative to an inner race of the first spherical bearing 3013.

In an optional embodiment of the present invention, a locking screw 3017 is further included to lock the orientation of the wedge block 3015. In another optional embodiment of the present invention, in order to facilitate the conversion from the linear movement to the final pivoting movement, the wedge block 3015 may define a kidney slot through the locking screw 3017 is inserted, allowing additional adjustment margin.

With such a design, an Ry-directional adjustment can be effected by turning the set screw 3016 to cause the wedge block 3015 to drive the bearing housing connecting block 3018 to move in the X-direction. As a result, the pivot shaft 302 that is coupled to the upper bearing housing 3012 and fixed at the lower end is forced to slightly swing in the Ry-direction. After the Ry-directional adjustment, the locking screw 3017 may be tightened.

In a further optional embodiment of the present invention, an Rx-directional adjustment is also possible in addition to the Ry-directional adjustment. Specifically, the adjusting mechanism 301 may further include an adjusting screw 3014. The adjusting screw 3014 is capable of changing relative positions of the bearing housing connecting block 3018 and the upper bearing housing 3012 with respect to the Y-direction so as to cause the upper bearing housing 3012 to swing in the Rx direction relative to the inner race of the first spherical bearing 3013.

In practice, the Rx-directional adjustment may follow the Ry-directional adjustment. Specifically, when the adjusting screw 3014 is turned, the upper bearing housing 3012 will move in the Y-direction. Fixed at the lower end, the pivot shaft 302 has to slightly swing in the Rx-direction, effectuating the Rx-directional adjustment.

The universal bearing assembly 303 will be described in detail below.

The universal bearing assembly 303 includes a second spherical bearing 3031, a lower bearing housing 3032 and a Z-directional adjustment block 3034. The lower bearing housing 3032 is connected to one end of the pivot shaft 3032 via the second spherical bearing 3031. The Z-directional adjustment block 3034 is configured to change the Z-directional position of the pivot shaft 3032 with the aid of a top block 3035.

In an optional embodiment, the universal bearing assembly 303 may further include a locking nut 3033 for locking the adjustment block 3034 in the Z-direction. In practical use, when the Z-directional adjustment block 3034 is turned, the Z-directional adjustment block 3034 will move in the Z-direction, causing the abutting top block 3035 to drive the reticle library assembly to move in the Z-direction to a desired position. After that, the locking nut 3033 is tightened.

Figure 3:
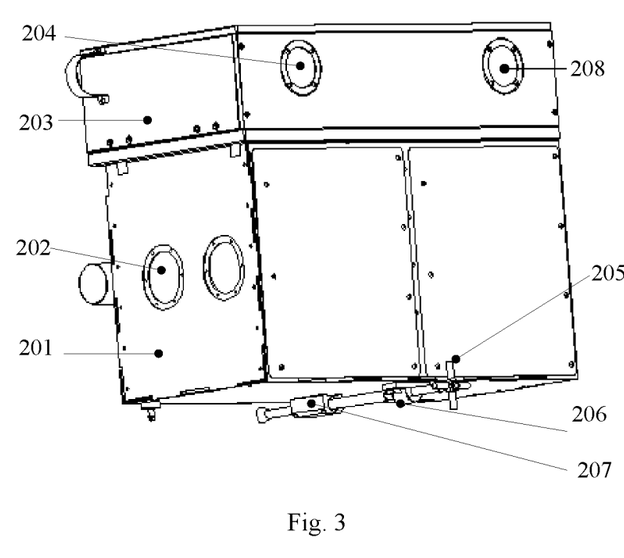
FIG. 3 is a schematic illustration of a frame assembly according to an optional embodiment of the present invention.

The frame assembly 2 will be described in detail below.

Referring to FIG. 3, the frame assembly 2 includes a reticle library assembly-supporting frame 203 and a storage system-supporting frame 201. The reticle library assembly-supporting frame 203 is arranged on the storage system-supporting frame 201. The reticle library assembly 4 is supported on the reticle library assembly-supporting frame 203. The storage system-supporting frame 201 is provided at the bottom a locking member for locking a configuration resulting from leveling by the pivot assembly 3.

The locking member includes a screw lever 205, a guide tube 206 and a threaded guide channel 207. The screw lever 205 is movable in the threaded guide channel 207 along the guide tube 206 and can be tightened to be locked with an external device. In another optional embodiment, the guide tube 206 or the threaded guide channel 207 is connected to the storage system-supporting frame 201.

Leveling by the pivot assembly 3 in the Z-, Rx and Ry-directions, together with locking of the locking member, constitutes the aforementioned first leveling stage.

Figure 7:
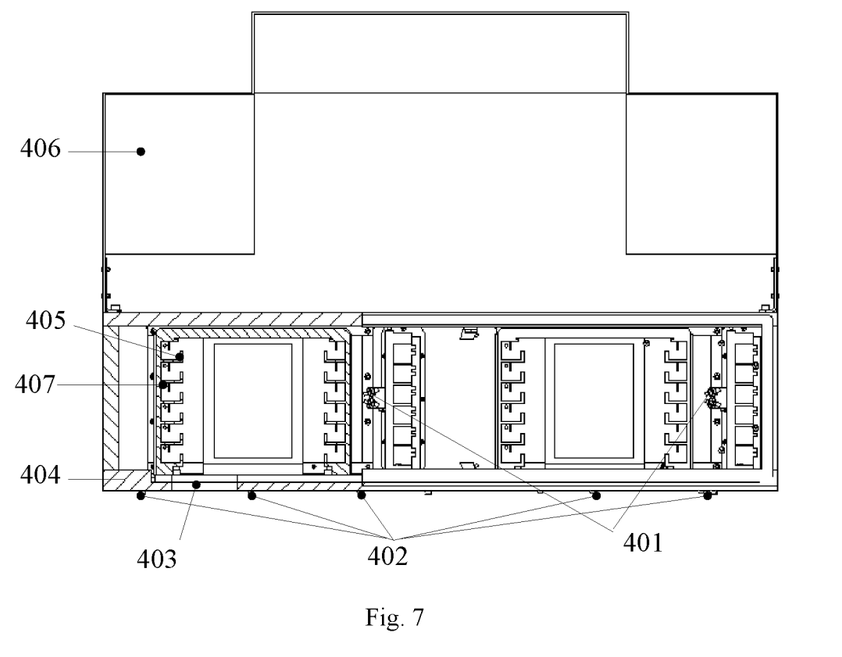
FIG. 7 schematically illustrates a reticle library assembly according to an optional embodiment of the present invention.

The second leveling stage is based on the first leveling stage and will be described in detail below. In a preferred embodiment of the present invention, several leveling screws 402 are provided for leveling between the reticle library assembly 4 and the frame assembly 2.

In an optional embodiment of the present invention, the frame assembly 2 is provided with an air-bath opening 204. The air-bath opening 204 is connected externally to an inert gas source and internally to the reticle library assembly 4 by an air-bath tubing 1. In a specific embodiment, nitrogen is introduced into the reticle library assembly 4 through the air-bath opening 204 as the inert gas, in order to protect and keep cleanness of reticles contained therein.

In an optional embodiment of the invention, the frame assembly is also provided with a particulate extraction opening 208 connected to the reticle library assembly 4 by a particulate extraction tubing 6. The articulate extraction tubing 6 is connected to the particulate extraction opening 208 and configured to extract possible fine particulate substances from the reticle library assembly 4.

The reticle library assembly 4 will be described in detail below.

Referring to FIG. 7, the reticle library assembly 4 includes a reticle library frame 404, a reticle library retained by the reticle library frame 404 and reticle bays 405 within the reticle library. The reticle bays 405 are configured to accommodate reticles. The reticle library assembly 4 may include deformation sensors 401. In other optional embodiments, the reticle library assembly 4 may further include presence sensors 407 and a cover 406 covering the reticle library 4. Each of the presence sensors 407 is configured to detect whether there is a reticle in a corresponding one of the reticle bays 405.

In a specific embodiment, the reticle library frame 404 is coupled at the bottom to the reticle library assembly-supporting frame 2203 and retains two reticle libraries. One or two reticle libraries may be retained depending on the user's practical needs. Each of the reticle libraries has six reticle bays 405 and can be individually leveled using the level screws 402 in the second leveling stage. The deformation sensor 401 is capable of detecting whether there is any reticle having experienced a deformation. The air-bath opening 204 is connected to the air-bath tubing in the reticle libraries, and the presence sensors 407 are configured to detect presence of reticles in the reticle bays. The present invention is not limited to the numbers of reticle libraries and of reticle bays in each reticle library, as described above by way of example, and they can be modified by those skilled in the art according to the practical needs.

Figure 8:
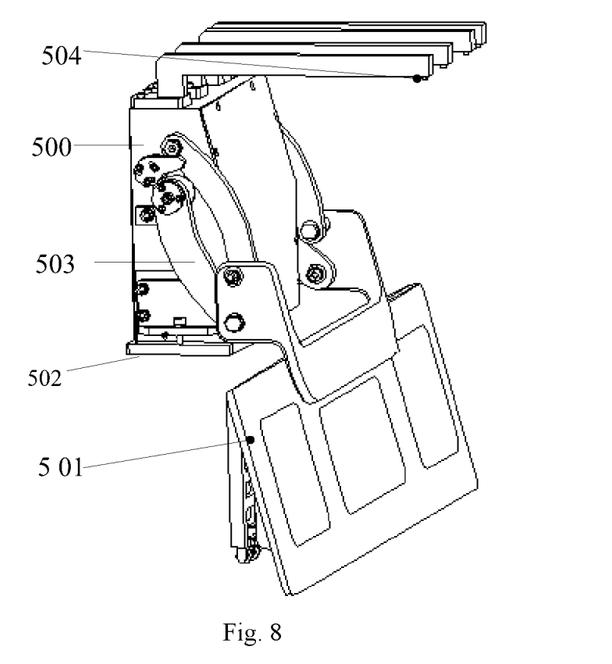
FIG. 8 schematically illustrates a seal according to an optional embodiment of the present invention.

In a preferred embodiment of the present invention, referring to FIG. 8, the reticle library system further includes a seal 5. The seal 5 is disposed on the reticle library assembly 4 in order to be closed to seal an opening of the reticle library assembly 4. With this design, when the reticle library assembly 4 is not in use to receive or supply a reticle, it is sealed by the seal 5 to allow the protective gas to be introduced in through the air-bath tubing.

In a further optional embodiment, the seal 5 may include a main body 500, a sealing door 501, a reticle library assembly-interfacing plate 502 and a pushback mechanism 503. The main body 500 is coupled to the reticle library assembly 4 or to the frame assembly 2 via the reticle library assembly-interfacing plate 502. The pushback mechanism 503 is mounted on the main body 500, and the sealing door 501 can be closed or opened to seal or not seal the opening of the reticle library assembly 4. The pushback mechanism 503 is driven to control the opening or closing of the sealing door 501.

According to the present invention, the control of the sealing door 501 may be accomplished by a variety of designs depending on distinct parameters, based on which the sealing door 501 is controlled, and the invention is not limited to any of such designs. For example, the seal 5 may further include an interlocking sensor 504. The interlocking sensor 504 is disposed on the main body 500 in order to detect whether a mechanical arm has arrived at a predetermined position for taking away or placing a reticle. In this case, the pushback mechanism 503 may be driven to control the opening or closing of the sealing door 501 based on a detection result of the interlocking sensor 504. It can be understood that, if the interlocking sensor 504 determines that the mechanical arm has reached the position, the pushback mechanism 503 will open the sealing door 501. Meanwhile, the interlocking sensor 504 can assure that the sealing door will not be closed during the fetching or placing operation of the mechanical arm, avoiding interference between the sealing door and the mechanical arm.

In an optional embodiment of the present invention, the pushback mechanism 503 may be implemented as a crank-link mechanism coupled to the sealing door 501, and its control may further involve the deformation sensors 401 and/or the presence sensors 407. For example, if no deformation is detected by the deformation sensors 401, the crank-link mechanism may be driven to rotate by a motor, causing a movement of the sealing door 501 connected thereto. Otherwise, human intervention may be introduced to avoid the sealing door from collide into the deformed reticle.

In summary, the present invention enables two stages of leveling respectively between the reticle library assembly and the frame assembly and between the frame assembly and the pivot assembly, which allow quick leveling with lower labor intensity.

In further optional embodiments, adjustments in the Z-directions, reduction of particulates on reticle surface, avoidance of deformation, secure interlocking, screw level-based locking and ease of maintenance can be made possible.

The invention claimed is:

1. A levellable reticle library system, comprising a reticle library assembly, a pivot assembly and a frame assembly, the reticle library assembly disposed on the frame assembly so that the reticle library assembly is able to be leveled by the pivot assembly via the frame assembly, the reticle library assembly also able to be leveled relative to the frame assembly,
wherein the pivot assembly comprises a pivot shaft, an adjusting mechanism, a frame assembly-interfacing member and a universal bearing assembly, two ends of the pivot shaft are respectively coupled to the adjusting mechanism and the universal bearing assembly, the pivot shaft is fixed to the frame assembly via the frame assembly-interfacing member, the adjusting mechanism is configured to level the frame assembly and the reticle library assembly thereon by adjusting an orientation of the pivot shaft.

2. The levellable reticle library system of claim 1, further comprising a seal disposed on the reticle library assembly in order to seal an opening of the reticle library assembly.

3. The levellable reticle library system of claim 2, wherein the seal comprises a main body, a sealing door, a reticle library assembly-interfacing plate and a pushback mechanism, the main body is connected to the reticle library assembly or to the frame assembly via the reticle library assembly-interfacing plate, the pushback mechanism is mounted on the main body, the sealing door is configured to be closed or opened to seal or not seal the opening of the reticle library assembly, the pushback mechanism is configured to be driven to control the opening or closing of the sealing door.

4. The levellable reticle library system of claim 3, wherein the seal further comprises an interlocking sensor disposed on the main body in order to detect whether a mechanical arm has arrived at a predetermined position for taking away or placing a reticle, and wherein the pushback mechanism is driven to control the opening or closing of the sealing door based on a detection result of the interlocking sensor.

5. The levellable reticle library system of claim 1, wherein the adjusting mechanism comprises a first spherical bearing, an upper bearing housing, a bearing housing connecting block, a wedge block and a set screw, the set screw engages the wedge block along a vertical Z-direction so that an X-directional displacement of the wedge block is achievable by means of a Z-directional advancement of the set screw, the wedge block is connected to the upper bearing housing via the bearing housing connecting block, the upper bearing housing is connected to one end of the pivot shaft via the first spherical bearing so that the pivot shaft is able to pivot in an Ry-direction relative to an inner race of the first spherical bearing by means of the X-directional displacement of the wedge block, wherein the Ry-direction is defined as a rotational direction about a horizontal Y-direction which is perpendicular to the horizontal X-direction.

6. The levellable reticle library system of claim 5, wherein the adjusting mechanism further comprises an adjusting screw capable of changing relative positions of the bearing housing connecting block and the upper bearing housing along the Y-direction so as to cause the upper bearing housing to swing in an Rx-direction relative to the inner race of the first spherical bearing, wherein the Rx-direction is defined as a rotational direction about the horizontal X-direction.

7. The levellable reticle library system of claim 1, wherein the universal bearing assembly comprises a second spherical bearing, a lower bearing housing and a Z-directional adjustment block, the lower bearing housing is connected to one end of the pivot shaft via the second spherical bearing, the Z-directional adjustment block is configured to change a Z-directional position of the pivot shaft via a top block.

8. The levellable reticle library system of claim 1, wherein the frame assembly comprises a reticle library assembly-supporting frame and a storage system-supporting frame under the reticle library assembly-supporting frame, wherein the reticle library assembly is supported on the reticle library assembly-supporting frame, and wherein a bottom of the storage system-supporting frame is provided with a locking member for locking a configuration resulting from leveling by the pivot assembly.

9. The levellable reticle library system of claim 1, wherein the frame assembly is provided with an air-bath opening which is connected externally to an inert gas source and internally to the reticle library assembly by an air-bath tubing.

10. The levellable reticle library system of claim 1, wherein the frame assembly is provided with a particulate extraction opening connected to the reticle library assembly by a particulate extraction tubing.

11. The levellable reticle library system of claim 1, wherein the reticle library assembly comprises a reticle library frame, and a reticle library retained by the reticle library frame and reticle bays within the reticle library assembly, the reticle bays are configured to accommodate reticles.

12. The levellable reticle library system of claim 1, wherein leveling between the reticle library assembly and the frame assembly is accomplished by a number of leveling screws.

13. The levellable reticle library system of claim 1, wherein the reticle library assembly comprises deformation sensors.

\* \* \* \* \*